(12) United States Patent
Yokokawa et al.

(10) Patent No.: US 6,959,854 B2
(45) Date of Patent: Nov. 1, 2005

(54) PRODUCTION METHOD FOR BONDED SUBSTRATES

(75) Inventors: Isao Yokokawa, Gunma (JP); Masatake Nakano, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 77 days.

(21) Appl. No.: 10/311,438

(22) PCT Filed: Apr. 9, 2002

(86) PCT No.: PCT/JP02/03522

§ 371 (c)(1),
(2), (4) Date: Dec. 16, 2002

(87) PCT Pub. No.: WO02/086975

PCT Pub. Date: Oct. 31, 2002

(65) Prior Publication Data

US 2004/0035525 A1 Feb. 26, 2004

(30) Foreign Application Priority Data

Apr. 18, 2001 (JP) .............................. 2001-119457

(51) Int. Cl.[7] .......................... B23K 28/00; B23K 1/20; H01L 21/30; H01L 21/46
(52) U.S. Cl. ..................................... 228/201; 438/455
(58) Field of Search ............................ 228/201, 205; 438/406, 455

(56) References Cited

U.S. PATENT DOCUMENTS 4,052,524 A * 10/1977 Harakas et al. ............. 428/383
6,033,764 A * 3/2000 Balents et al. .............. 428/209
6,156,624 A * 12/2000 Yamagata et al. .......... 438/459

(Continued)

FOREIGN PATENT DOCUMENTS

| EP | 0823607 | 2/1998 |
|---|---|---|
| EP | 0971396 | 1/2000 |
| JP | 03-097215 | 4/1991 |
| JP | 07-058303 | 3/1995 |
| JP | 09-186127 | 7/1997 |

OTHER PUBLICATIONS

Koyoshi Mitani et al., "Causes and Prevention of Temperature-Dependent Bubbles in Silicon Wafer Bonding", Japanese Journal of Applied Physics, vol. 30, No. 4, Apr. 1991, pp. 615-622.

(Continued)

*Primary Examiner*—Lynne R. Edmondson
(74) *Attorney, Agent, or Firm*—Hogan & Hartson, LLP

(57) ABSTRACT

There is provided a method for producing a bonded substrate comprising, at least, a process of joining two substrates and a process of subjecting the joined substrates to heat treatment to bond them firmly, wherein, at least, a process of cleaning for removing contaminants on the surface of the substrates is performed before joining the substrates, and then a process of drying the cleaned surface of the substrates is performed without using the water displacing method for the drying process, so that moisture is left on the substrates before joining to increase a joining strength after joining the substrates. Thereby, there can be provided a method for producing a bonded substrate wherein a joining strength of the joining interface of the substrates to be joined is improved, and thus the bonded substrate wherein there is no void failure and blister failure in the bonding interface of a bonded substrate after bonding heat treatment can be produced at high productivity and high yield.

18 Claims, 5 Drawing Sheets

U.S. PATENT DOCUMENTS

| | | | |
|---|---|---|---|
| 6,180,496 B1 * | 1/2001 | Farrens et al. | 438/455 |
| 6,214,472 B1 * | 4/2001 | Barton et al. | 428/446 |
| 6,270,202 B1 * | 8/2001 | Namba et al. | 347/68 |
| 6,410,436 B2 * | 6/2002 | Yamagata et al. | 438/689 |
| 2002/0192422 A1 * | 12/2002 | Conzone et al. | 428/64.1 |

OTHER PUBLICATIONS

Takao Abe, "A Silicon Crystal Growth and Wafer Processing", Baifukan, 1994, p. 330.

Surface Science Technology Series 4, Science of SOI, Realize Corporation, 2000, p. 300.

* cited by examiner

PRODUCTION METHOD FOR BONDED SUBSTRATES

TECHNICAL FIELD

The present invention relates to a cleaning process and a drying process before bonding substrates as a material in manufacture of a bonded substrate.

BACKGROUND ART

After cleaning and drying of one or more kinds of substrates as a material, the material substrates are joined, in manufacture of a bonded substrate. Then, they are subjected to heat treatment for increasing a joining strength at a joining interface of the joined substrate, thereby they are bonded firmly, and then one of the substrates is made thin. Thereby, a bonded substrate is manufactured. At this time, the drying process conducted after the process of cleaning material substrates is usually carried out by a water displacing method represented by a method comprising putting a substrate into a heated vapor of IPA (isopropyl alcohol) which is one of highly volatile organic solvents, and drying it by increasing a temperature of the substrate to a vapor temperature with replacing moisture adhered on the substrate surface with condensed IPA (hereafter referred to as IPA vapor drying method).

If particles or an organic substance exist on the joining surface of a substrate as a material when joining the material substrates in manufacture of a bonded substrate, the particles and the organic substance will prevent the joining surfaces from being joined, and will form a non-joined part in the joining interface. It causes a void failure and a blister failure in the bonding interface of the bonded substrate after heat treatment for bonding. Especially, when a joining strength at a joining interface is weak, a void failure and a blister failure tend to be caused easily even if the heat treatment for bonding is performed, and a size thereof also tends to become large.

FIG. 2 is a schematic view of a longitudinal section of a SOI wafer as an example of a bonded substrate in which the above failures are generated.

The SOI wafer is formed by stacking an oxide film 10 and an active silicon layer 9 on a base wafer 2, and a non-bonded part is generated in these layers due to a void failure 13 and a blister failure 12.

In a drying process performed after a process of cleaning a substrate as a material in manufacture of a bonded substrate which is conventionally performed, a water displacing method such as the IPA vapor drying method described above is adopted. When a bonded substrate is produced using the substrates dried by the water displacing method, the above-mentioned void failure and blister failure tend to be generated easily, and reduce productivity and yield of the bonded substrate.

The water displacing method is a method of replacing moisture adhered on a substrate surface with a highly volatile organic solvent to dry the substrate quickly. As a solvent for displacement, IPA which is the easiest to use industrially has been used widely.

Furthermore, since the fire might occur when performing the IPA vapor drying method, much plant investment for safety has been required therefor. Moreover, since IPA is a high-grade chemical, it is expensive. Therefore, the manufacture cost gets high when using it.

DISCLOSURE OF THE INVENTION

The present invention has been accomplished to solve the above-mentioned previous problems. An object of the present invention is to provide a method for producing a bonded substrate wherein a joining strength of the joining interface of the joined substrates is improved by performing a process of cleaning material substrates before joining and subsequently performing a drying process adequately, and thus the bonded substrate wherein there is no void failure and blister failure in the bonding interface of a bonded substrate after bonding heat treatment can be produced at high productivity and high yield.

In order to realize the above-mentioned object, a method for producing a bonded substrate according to the present invention is a method for producing a bonded substrate comprising, at least, a process of joining two substrates and a process of subjecting the joined substrates to heat treatment to bond them firmly, wherein, at least, a process of cleaning for removing contaminants on the surface of the substrates is performed before joining the substrates, and then a process of drying the cleaned surface of the substrates is performed without using the water displacing method for the drying process, so that moisture is left on the substrates before joining to increase a joining strength after joining the substrates.

As described above, if the substrates are joined by performing a process of cleaning for removing contaminants on the surface of the substrates before joining the substrates, and then performing a process of drying the cleaned surface of the substrates without using the water displacing method for the drying process, to leave moisture on the surface of the substrates before joining, a joining strength can be increased strongly by a hydrogen bond, silanol-group bond or the like. Furthermore, if the joined substrates are bonded by bonding heat treatment, a bonded substrate having a strong bonding strength at a bonding interface can be produced. Furthermore, since particles and organic substance contamination on the substrates used as material can be reduced, a bonded substrate which has high quality and has neither void failure nor blister failure at a bonding interface after bonding heat treatment can be manufactured at high productivity and at high yield.

In this case, a joining strength at a joining interface after joining is preferably 0.25 N/m$^2$ or more.

As described above, according to the present invention, a joining strength of 0.25 N/m$^2$ or more at a joining interface after joining can be achieved easily, and therefore a bonding strength at interface of the bonded substrate after bonding heat treatment can be increased compared with conventional one. Moreover, if it is higher than the value, it is higher than the delamination strength of the fine bubble layer at the time of performing delamination, for example, in a hydrogen ion implantation delamination method. Therefore, neither a void failure nor a blister failure is caused at a joining interface.

In this case, the drying process can be a process of removing moisture on the cleaned surface of a substrate by sucking.

This process is a process of putting almost perpendicularly a material substrate on a stage for drying in which a vacuum suction line is installed, and sucking moisture from a lower part of the substrate to remove the moisture on the surface of the material substrate. Since two or more of the substrates can be simultaneously dried by putting two or more of the substrates on a stage for drying, high productivity can be achieved. Moreover, the amount of moisture left on the surface of the substrate used for a joining process can be made adequate.

Moreover, in this case, a drying process can be a process of removing the moisture on the surface of the cleaned substrate by rotating the substrate at a high rotational speed.

In this process, the moisture on a material substrate is removed using centrifugal force generated by a high-speed rotation of the substrate. A general spin dryer corresponds thereto. Also by the spin dryer, the moisture content left on the substrate surface can be made adequate.

Furthermore, in this case, a cleaning process is a process of performing the last rinse with hot water, and the following drying process can be a process of evaporating to remove the hot water on the cleaned surface of the substrate.

As described above, if hot water is used as a rinse solution for the last rinse tank in the cleaning process, and the substrate is raised from the last rinse tank slowly, the hot water on the surface of the material substrate is evaporated, and the moisture on the material substrate can be removed. In this case, in order to ensure drying, the material substrate may be subjected to IR irradiation. Moreover, since two or more substrates can be processed simultaneously, productivity is high. Furthermore, it is possible to make the moisture content left on the surface of the substrate adequate.

In the present invention relating to a method for producing a bonded substrate, a substrate which serves as a material of a bonded substrate is preferably a silicon substrate, more preferably a silicon substrate having an oxide film, still preferably those in which hydrogen, rare gas, or halogen gas is implanted.

The substrate which serves as a material of a bonded substrate may be used with combining two or more kinds of substrates depending on a kind of a device and a use as described above. Especially, if a bonded substrate is produced by using a silicon substrate, a silicon substrate having an oxide film, or a silicon substrate in which hydrogen, rare gas, or halogen gas is implanted, and applying a cleaning process and a drying process of the present invention thereto, a bonded substrate with strong joining strength and a firm bonding strength wherein neither contamination nor failures exist can be provided.

According to the present invention, there can be provided a bonded substrate wherein the material substrates without particles or organic substance contamination manufactured by the above-mentioned manufacture method are firmly joined, a joining interface strength is further increased by bonding heat treatment, and neither void failure nor blister failure exists at a bonding interface.

As explained above, according to the present invention, moisture is left on the material substrate before joining by using a drying method without using a water displacing method in a drying process after the cleaning process before joining, and thereby the joining strength at the joining interface after joining can be increased remarkably. Moreover, since the material substrate is not charged with static electricity, contamination by particles with a size of 0.2 μm or more is decreased. Furthermore, since an organic solvent is not used, organic substance contamination is also reduced. Therefore, a void failure and a blister failure is decreased at the bonding interface of a bonded substrate, and a production yield of a bonded substrate is improved remarkably. Furthermore, since chemicals used in a water displacing method are not used, operation can be conducted safely, cost for chemicals and equipment for safety become unnecessary, and thus manufacture cost can be reduced.

BEST MODE FOR CARRYING OUT THE INVENTION

Figure 1:
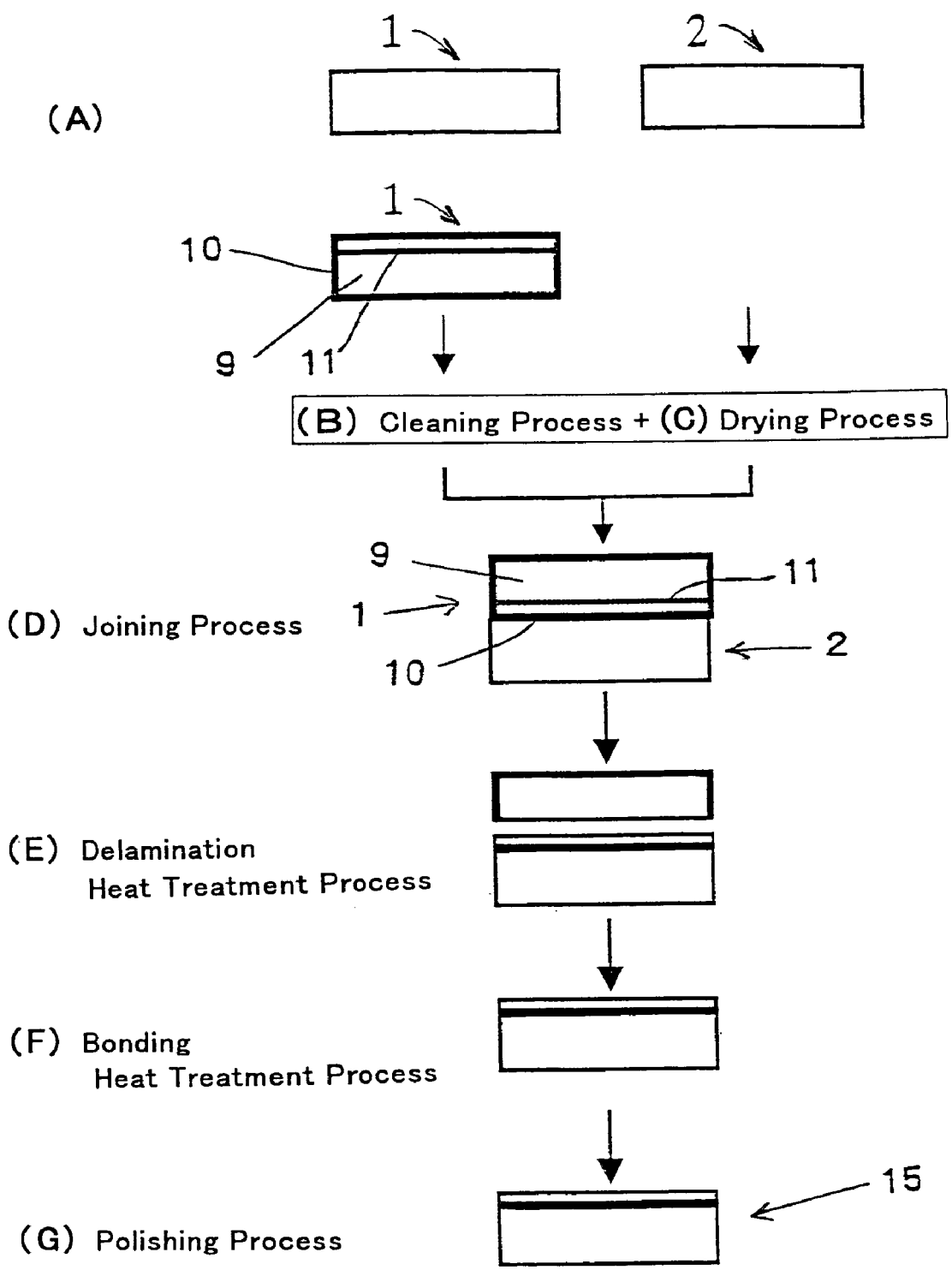
FIG. 1 is a process chart showing one embodiment of a method for producing a bonded substrate according to the present invention.

Hereafter, the present invention will be explained in detail.

The inventors of the present invention have thoroughly studied as for a cause that a joining strength obtained at a joining process of a bonded substrate is weaker in some cases than a delamination strength of a fine bubble layer (occasionally referred to as an ion implanted layer, or a hydrogen high concentration layer) at the time of performing delamination, for example, in the hydrogen ion implantation delamination method (occasionally referred to as an ion implantation delamination method, or a smart cut method), and have found that it is apt to be weaker in the case that a water displacing method, such as IPA vapor drying method, is used in the drying process performed after the cleaning process of material substrates. Then, they have searched for the drying methods and the drying conditions that this phenomenon is avoidable, and further studied the conditions. Thereby, they have completed the present invention.

Namely, it has been turned out that since the moisture and OH groups on the substrate volatilizes nearly completely according to the water displacing method, the moisture and OH groups contributing to a hydrogen bond at a joint interface of a bonded substrate are not enough, and thus the joining strength at a joining interface is lowered.

Moreover, static electricity was charged on the surface of the substrate after drying, and particles with a size of 0.2 μm or more tend to adhere on the surface of the substrate. Furthermore, since IPA itself is an organic solvent, the surface of the material substrate was contaminated with the organic substance.

According to the present invention, the water displacing method such as IPA vapor drying method is not used as a drying method in the drying process performed after the cleaning process for cleaning a material substrate, to leave moisture and OH groups contributing to a hydrogen bond on the surface of the substrate before joining. Thereby, joining which mainly consists of a hydrogen bond is achieved, and a joining strength at a joining interface is increased. Moreover, since electrification of the material substrate with static electricity can be prevented by the remaining moisture, adhesion of particles with a size of 0.2 μm or more to the surface of a material substrate can be reduced. Furthermore, since an organic solvent such as IPA is not used in this drying method which does not use a water displacing method, contamination of the surface of the material substrate with organic substance after drying is not caused.

As described above, a joining strength at the joining interface of a joined substrate will be remarkably improved according to the present invention. Therefore, a bonding strength of a bonded substrate after bonding heat treatment is reinforced, and the production yield can be raised.

In the present invention, "joining strength" is a generic term for a bonding strength at a joining interface before performing the bonding heat treatment at high temperature of 1000° C. or more, and it is distinguished from "bonding strength" after the bonding heat treatment.

Example of drying methods of the present invention wherein a water displacing method is not used and moisture is left on the surface of the substrate includes an suction drying method.

Figure 8:
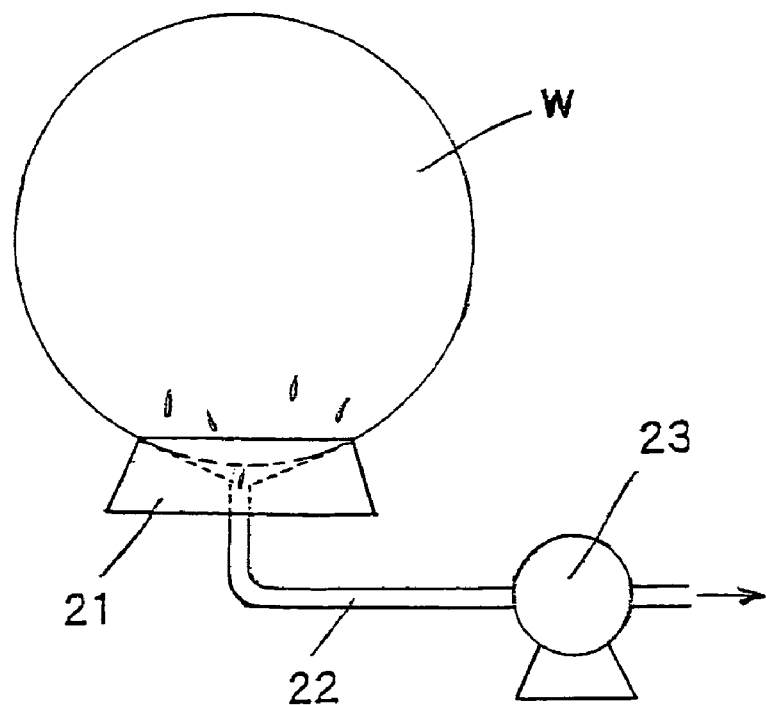
FIG. 8 is an explanatory view showing an suction drying method.

As shown in FIG. 8, it is a method wherein a material substrate W is perpendicularly put on a stage for drying 21 in which a vacuum suction line 22 is installed, and clean air existing around both surfaces of the substrate W is sucked as an air current with a vacuum pump 23, and water drops and a water film on both surfaces of the substrate W is sucked to be removed and dried at the same time. Since the moisture content on the surface of the material substrate can be made adequate amount according to this method, without decreasing it too much unnecessarily, drying can be achieved with leaving the moisture necessary for joining on the surface of the substrate. Moreover, since a lot of substrates can be dried simultaneously, by putting two or more sheets of the substrates on a stage for drying, improvement in productivity can be achieved.

Moreover, a so-called spin dryer can be used for the drying process of the present invention.

Figure 9:
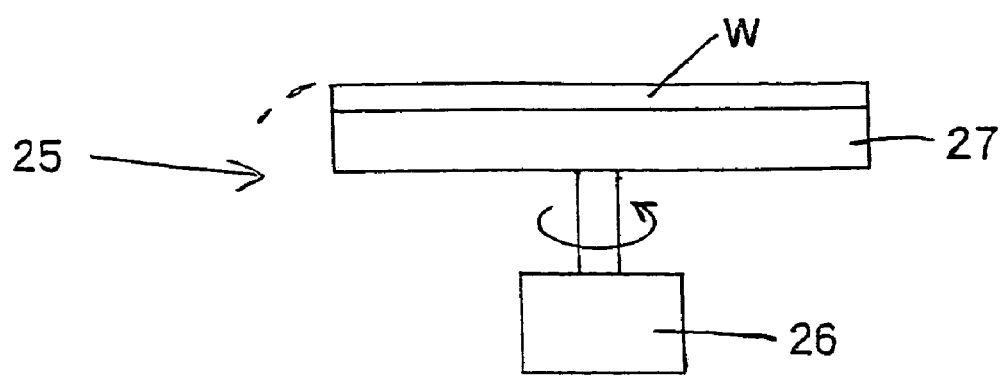
FIG. 9 is an explanatory view showing a spin drying method.

A spin dryer 25 shown in FIG. 9 has a susceptor 27 which is rotated at high speed by a motor 26. The material substrate W is placed on a susceptor 27, and the moisture on the material substrate W is removed by a centrifugal force generated by rotating the substrate W in the level state at high-speed. The moisture content left on the surface of the material substrate can be made adequate also in this case.

Moreover, according to the present invention, there can be used a method of removing moisture on the material substrate by using hot water as a rinse solution for the last rinse tank in a cleaning process, and evaporating the hot water on a material substrate by raising the substrate from the last rinse tank slowly (hereafter referred to as the hot water raising drying method). At that time, the material substrate may be subjected to IR (infrared radiation) irradiation in order to ensure drying. Moreover, since two or more substrates can be processed simultaneously, productivity is high. Also in that case, the moisture content remaining on the dried surface of the substrate can be made an adequate amount.

According to the present invention described above, safer operation is possible since highly inflammable chemicals such as IPA are not used, and the manufacture cost of a bonded substrate can be reduced since safety measures which needs a large amount of equipment cost and the cost for chemicals such as IPA or the like are not necessary, compared with the IPA vapor drying method or the like used as a conventional water displacing method. In addition, according to the present invention, the above-mentioned drying process may be repeated two or more times.

The present invention can be applied to a SOI (Silicon on Insulator) substrate, a SOQ (Silicon on Quartz) substrate, a dielectric isolated substrate, a substrate obtained by joining silicon wafers each other without an oxide film and any other bonded substrates which can be produced by a joining method. Moreover, it can be applied to any methods irrespective of a method of producing a bonded substrate, as far as it is a method comprising a cleaning process, a drying method and a joining method.

Especially, in manufacture of a bonded substrate according to the hydrogen ion implantation delamination method, a material substrate is delaminated by the hydrogen high concentration layer formed in the material substrate. Although an ion implantation method is used for formation of this hydrogen high concentration layer, it degrades a quality of the surface of the substrate, and therefore the joining strength at the joining interface at the time of delaminating the joined material substrates gets weak. Therefore, there is a disadvantage that a void failure and a blister failure are easily caused at a joining interface. However, if a drying method wherein moisture is left on the surface of the substrate is used as in the present invention, the moisture and OH groups contributing to a hydrogen bond at a joining interface are remarkably increased compared with a water displacing method. Thus, a joining strength at the joining interface at the time of delamination is improved, a void failure and a blister failure are decreased remarkably, and the quality of the joining interface and the production yield are improved.

As described above, since the joining strength at the joining interface of a joined substrate is improved, and particles and organic substance contamination is decreased from the material substrate at the same time, by using the drying method wherein the moisture is left on the surface of the substrate instead of a water displacing method, a bonding strength is reinforced by bonding heat treatment. Therefore, a bonded substrate with high quality wherein there is neither a void failure nor a blister failure at the bonding interface can be obtained at high productivity and high yield.

Hereinafter, the method of producing a bonded substrate according to the present invention will be explained with referring to drawings.

FIG. 1 is a process chart showing overview of one embodiment of a method for producing a bonded substrate according to the present invention. Production process of the SOI substrate using the hydrogen ion implantation delamination method which is a kind of methods of producing a bonded substrate is explained here as an example.

In FIG. 1, two bare wafers are prepared as material substrates (A). Although there are various substrates, such as a mirror-polished wafer, an epitaxial wafer, and a heat treated substrate, as a bare wafer, they are applicable to the present invention irrespective of the kind.

First, an oxide film 10 is formed on the surface of a bare wafer prepared as a bond wafer 1. Hydrogen ion implantation is carried out on the surface of the bond wafer 1 which the oxide film 10 is formed on the surface thereof, and thereby the hydrogen high concentration layer 11 is uniformly formed at a desired depth. The depth of the hydrogen high concentration layer 11 will determine the thickness of the obtained SOI layer.

Next, a bare wafer is used as it is as a base wafer 2. It is also possible that a bare wafer is used as the bond wafer 1, and a wafer with an oxide film is used as the base wafer 2. Moreover, it is also possible that both are a bare wafer or a wafer with an oxide film.

In order to remove particles, an organic substance or the like adhered on the surface of these material substrates, a cleaning process (B) is performed before joining the material substrates. At this cleaning process, the so-called RCA cleaning or the like is conducted. Then, the method wherein the moisture is left on the surface of the wafers is adopted instead of a water displacing method in the subsequent drying process (C), and drying is conducted so that moisture and OH groups may be left on the material substrates before joining.

Next, in a joining process (D), the surface of the bond wafer 1 and the surface of the base wafer 2 which moisture remains on the surface of are joined. Since they easily suffer from particles contamination and organic substance contamination at this time from the atmosphere of a joining process or the container in which the material substrates are stored, it is desirable to perform a joining process as early as possible, after performing the cleaning process and the drying process.

In a delamination heat treatment process (E), if the joined substrates are subjected to a heat treatment at a low temperature as about 400–600° C., a defect layer will be formed in the hydrogen high concentration layer 11 formed in the bond wafer 1. If the defect layer becomes continuous horizontally in the bond wafer 1, the bond wafer 1 can be delaminated. Thereby, a part of the bond wafers 1 is transferred to the base wafer 2 to produce a SOI substrate.

In a bonding heat treatment process (F), in order to increase a joining strength at a joining interface, they are subjected to bonding heat treatment of 1000° C. or more in the oxidizing atmosphere or the non-oxidizing atmosphere, and bonded together firmly to be stabilized. Finally, in a polishing process (G), the damage of the SOI layer surface is removed, and polishing for improving micro roughness is performed. Heat treatment such as hydrogen annealing or the like can also be conducted instead of polishing.

The SOI wafer 15 according to the hydrogen ion implantation delamination method is produced by the series of the processes described above.

Figure 3:
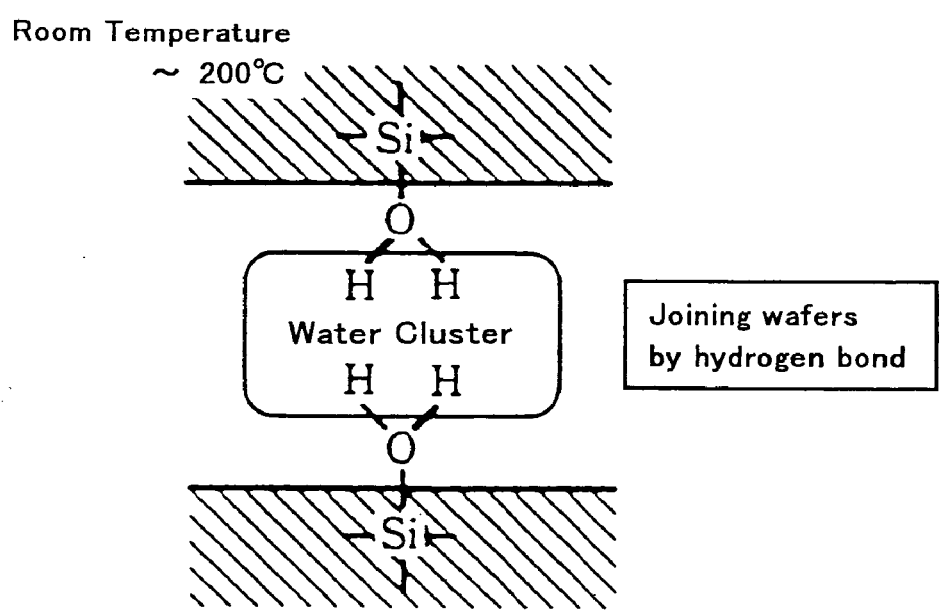
FIG. 3 is an explanatory view showing a joining state at a joining interface of the joined substrate when material substrates are joined at 200° C. or lower.

FIG. 3 is a schematic view explaining the joining state at the joining interface of the joined substrate joined at 200° C. or lower (See, Takao Abe, a silicon crystal growth and wafer processing, Baifukan, 1994, p.330). FIG. 3 shows that the joining state at the joining interface is hydrogen bonds mainly consisting of moisture and OH groups. Therefore, a joining strength at a joining interface is improved when moisture and OH groups at a joining interface exist moderately a lot.

Figure 4:
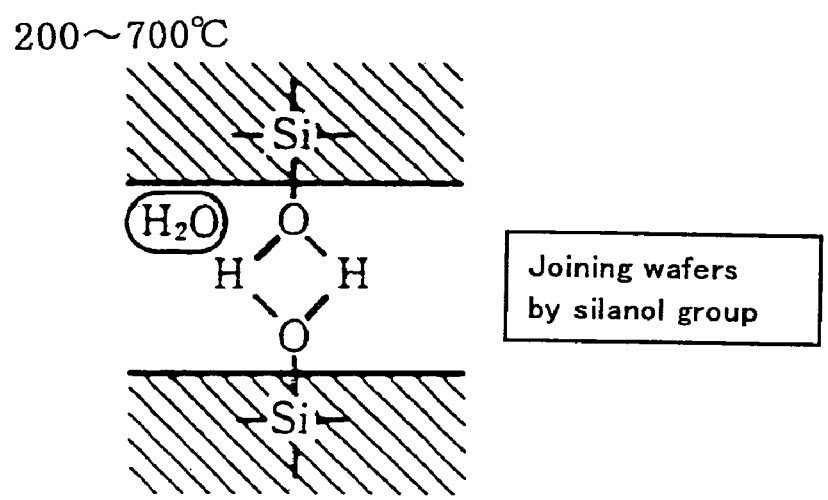
FIG. 4 is an explanatory view showing a joining state at a joining interface of the joined substrate when material substrates are joined at 200° C.–700 ° C.

FIG. 4 is a schematic view explaining the joining state at the joining interface of joined substrates after performing low-temperature heat treatment at 200–700° C. after joining (See, Takao Abe, a silicon crystal growth and wafer processing, Baifukan, 1994, p.330). In this case, it is found that the joining state of a joining interface is a joining mainly consisting of silanol groups. However, since joining at a joining interface is gradually changing from the hydrogen bond to a joining mainly consisting of silanol groups as heat treatment temperature is raised, an actual joining at joining interface is in the state where hydrogen bonds and silanol-group joining exist together. Therefore, the joining strength after heat treatment is also improved more, when the moisture and OH groups exist moderately a lot at a joining interface at the time of joining.

By the way, according to the hydrogen ion implantation delamination method, if $1\times10^{16}$ ions/cm$^2$ or more of hydrogen exists in a material substrate, a fine defect layer will be formed at a temperature of 400° C. or more, and delamination will occur. As mentioned above, at the temperature of 400° C. or more, the joining state at a joining interface is in the state that both bond by silanol groups and hydrogen bonds exist together. Therefore, if moisture and OH groups exist moderately a lot on the material substrate at the time of joining, a joining strength at a joining interface can be improved, and a void failure and a blister failure can be reduced.

Moreover, according to the hydrogen ion implantation delamination method, a fine defect layer generating in a material substrate is formed even at 400° C. or less if a dose of hydrogen implanted into a material substrate is $1\times10^{17}$ ions/cm$^2$ or more. With the more dose of implantation of hydrogen, lower delamination heat treatment temperature is possible, which may lead to joining at a joining interface mainly consisting of hydrogen bonds. Therefore, a joining strength at a joining interface is weak and a void failure and a blister failure are easily caused. However, if moisture and OH groups are allowed to exist moderately a lot on material substrates at the time of joining, and to raise a joining strength at a joining interface, a void failure and a blister failure can be reduced even when it is delaminated at low temperature. It is also applied in the same way to a technology of performing an delamination process at a room temperature by exciting hydrogen and implanting it in the state of plasma.

Then, an amount of moisture on the material substrate after performing a cleaning process and a drying process which are performed before joining was compared as for an suction drying method which does not use a water displacing method and an IPA vapor drying method which uses a water displacing method.

Figure 5:
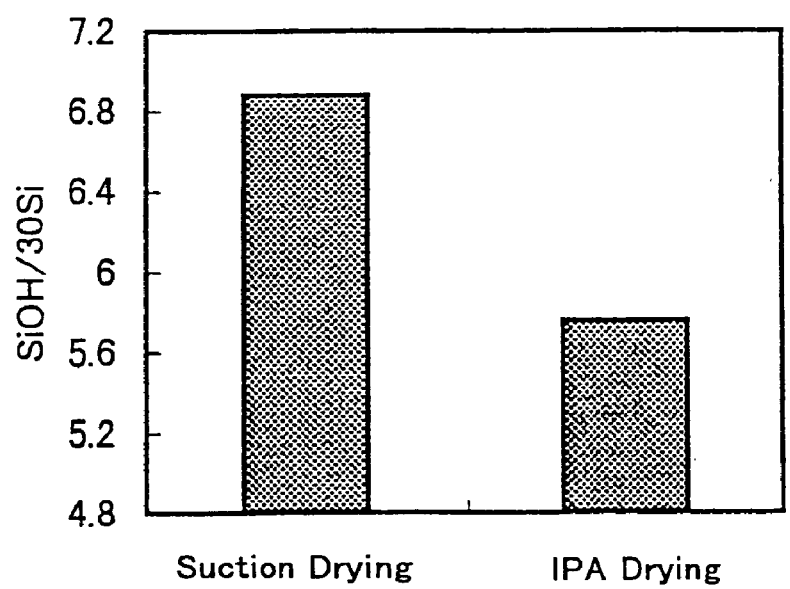
FIG. 5 is a diagram wherein amounts of the SiOH group on the material substrate after drying substrate according to drying methods are compared using TOF-SIMS method.

First, there is shown the result of measurement of SiOH groups on the material substrate after drying of the substrate according to the TOF-SIMS method (Time-of-flight type secondary ion mass spectrometry). FIG. 5 shows the amount of the SiOH fragment detected from the substrate surface. In order to make the difference depending on the drying method easy to be compared, it is standardized by 30Si. As a result, it has been found that there are more SiOH groups contributing to joining at a joining interface in the case of the suction drying method which does not use a water displacing method compared with the IPA vapor drying method which uses a water displacing method.

Figure 6:
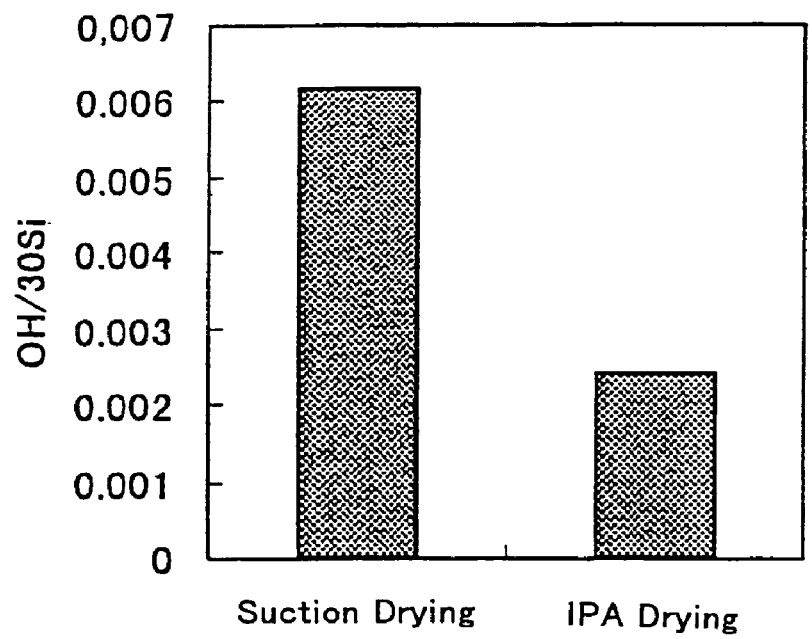
FIG. 6 is a diagram wherein amounts of the OH on the material substrate after drying substrate are compared using TOF-SIMS method.

Moreover, FIG. 6 shows an amount of OH fragments detected from the substrate surface. In order to make the difference depending on the drying method easy to be compared, it is standardized by 30Si. As a result, it has been found that there are more OH groups contributing to joining at a joining interface in the case of the suction drying method which does not use a water displacing method compared with the IPA vapor drying method which uses a water displacing method. Accordingly, it was found from the result of the TOF-SIMS method that more OH and a SiOH groups exist on the material substrate dried according to the suction drying method compared with the IPA vapor drying method which uses a water displacing method.

Figure 7:
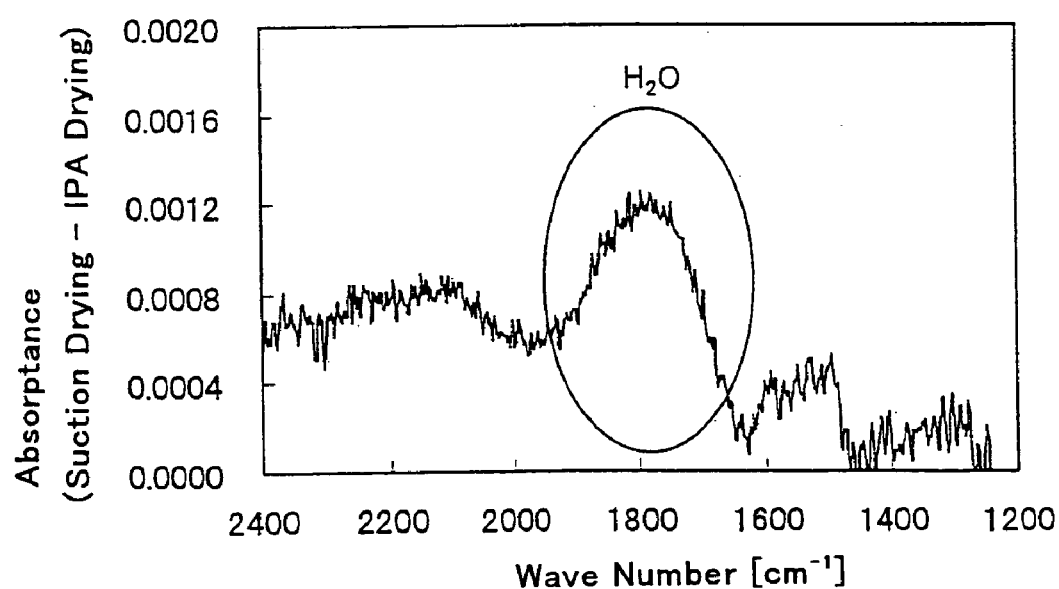
FIG. 7 is a diagram wherein the moistures on the material substrate after drying substrate according to drying methods are compared using ATR-IR method.

Then, the results of measurement of the moisture and SiOH groups on the material substrate after drying of the substrate using the ATR-IR (Attenuated Total Reflection Infrared) spectroscopy (hereafter referred to as the ATR-IR method) are shown in FIG. 7. Although the results are expressed with a wave form, it is expressed as a wave form wherein the wave form of the IPA vapor drying method is deducted from the wave form of the suction drying method, in order to make the difference depending on the drying method easy to be compared. As a result, the peak around the 1800 cm$^{-1}$ which shows moisture swayed to the positive side, and therefore it was observed that there was a tendency that more moisture exists in the case of the suction drying method compared with the IPA vapor drying method. Therefore, it has been found from the result of the ATR-IR method that more moisture exists in the case of the suction drying method which does not use a water displacing method compared with the IPA vapor drying method which uses a water displacing method.

The present invention will be explained below with referring Example and Comparative example of the present invention. However, the present invention is not limited thereto.

EXAMPLE

It was investigated using a razor blade method how the difference in an amount of moisture on a material substrate due to the difference in a drying method performed at a drying process after a cleaning process before joining affected a joining strength at a joining interface of the joined substrate (reference as for the razor blade method: edited by UCS semiconductor substrate technical research meeting, Science of SOI, Realize Corporation, 2000, p.300).

A SOI substrate was produced using a hydrogen ion implantation delamination method which was a kind of methods of producing a bonded substrate. A process for producing is based on the process chart shown in FIG. 1.

First, a bond wafer produced by implanting $8 \times 10^{16}$ ions/cm$^2$ of hydrogen ions into a silicon substrate having a diameter of 8 inches with 150 nm of an oxide film, and a bare silicon substrate as a base wafer were prepared.

Next, both of the wafers were cleaned with a RCA cleaning solution, and then rinsed enough with pure water. Then, both of the wafers were dried according to the suction drying method. Subsequently, the oxide-film side of the bond wafer and one side of the base wafer were joined at a room temperature. Then, after subjecting the joined substrates to heat treatment at 300° C. at which a hydrogen high concentration layer is not delaminated, the joining strength at a joining interface was measured by the razor blade method. It was 0.28–0.33 N/m$^2$.

Then, as described above, a bonded substrate was produced according to the hydrogen ion implantation delamination method using a wafer treated by the same way as the wafer used for the measurement of the joining strength. A good product yield of the bonded substrate after a delamination heat treatment process at 500° C. for 30 minutes was investigated.

Figure 2:
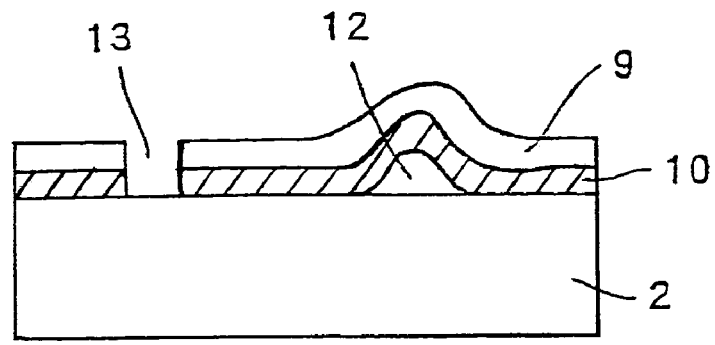
FIG. 2 is an explanatory view showing blister failure and void failure in a bonded substrate.

A good product as for a bonded substrate after the delamination heat treatment process herein means a substrate in which neither the void failure nor the blister failure as shown in FIG. 2 is observed on the surface of the bonded substrate obtained after the delamination heat treatment process, when observed by visual inspection under a fluorescent lamp. On the other hand, a good product yield of a bonded substrate after the delamination heat treatment process is a value calculated by dividing the number of good products among bonded substrates after an delamination heat treatment process by the number of the loaded substrates, and multiplying it by 100.

As described above, 16 bonded substrates were produced by drying according to the suction drying method, and 15 sheets of good products could be obtained (good product yield: 94%).

Furthermore, the number of particles on the substrate as a material to which the drying process was performed after the cleaning process before joining was measured with a particle counter SP 1 manufactured by KLA-Tencor Corporation using a monitor substrate. As for the suction drying method, only five or less particles with 0.2 μm or more were detected per a wafer with a diameter of 8 inches.

COMPARATIVE EXAMPLE

A SOI wafer according to the hydrogen ion implantation delamination method was produced by the same processes except that the IPA vapor drying method being a water displacing method was used for the drying process after the cleaning process before joining, as a comparative example.

A joining strength of a joining interface of the joined substrates was measured by the razor blade method in a similar way to Example. It was 0.18–0.22 N/m$^2$.

Sixteen bonded substrates subjected to the delamination heat treatment at 500° C. for 30 minutes were produced. Only 7 sheets of good products could be obtained (good product yield: 44%).

Furthermore, the number of particles was measured using a monitor substrate. On the substrate as a material to which the IPA vapor drying was performed before joining, ten or less particles with a size of 0.2 μm or more were detected per a wafer with a diameter of 8 inches.

From the result of Example and Comparative example described above, it was found that the joining strength at a joining interface was improved more when using the suction drying method (Example) which did not use a water displacing method, since moisture and OH groups remain moderately on the material substrate.

Moreover, if IPA vapor drying method which is a water displacsing method is performed, the surface of the material substrate after being dried may be charged with static electricity. Therefore, it could be understood that particles which exist in a place for recovering substrates in a drying process, in a box for storing substrates or in the atmosphere of a joining process may be easily adhered thereto.

As described above, moisture or OH groups exist moderately a lot on a material substrate, when using the suction drying method which does not use a water displacing method. Therefore, the joining strength at a joining interface can be raised in the delamination process, while a joining strength at a joining interface is weak in the case of IPA vapor drying which uses a water displacing method. Moreover, since static electricity is not generated, the particle contamination on a material substrate can be decreased. Furthermore, since organic solvents, such as IPA, are not used, organic substance contamination can also be reduced. Therefore, a quality of a joining interface is improved, and production yield of a bonded substrate after bonding heat treatment is improved.

The present invention is premised that the IPA vapor drying method which uses a water displacing method is not used in the above-mentioned embodiment. However, a joining strength of a joining interface of a joined substrate could be raised to 0.25–0.31 N/m$^2$ by once performing IPA vapor drying, then moistening a substrate only with pure water again and performing a drying method for leaving moisture on a substrate without using water displacing method, from 0.18–0.22 N/m$^2$ in the case of performing only IPA vapor drying. Therefore, it was found that a joining strength at a joining interface could be raised also by moistening a substrate only with pure water after IPA vapor drying, then performing the present drying method with leaving moisture on the substrate.

Furthermore, a good product yield after an delamination process was investigated. As for the sample in the comparative example wherein IPA vapor drying was carried out, only seven sheets of good products could be obtained when 16 sheets were treated (a good product yield: 44%). As for the sample which was moistened again after IPA vapor drying and then subjected to the suction drying method in the above way, twelve sheets of good products could be obtained when 16 sheets were treated (a good product yield: 75%).

According to this experiment, the suction drying method is conducted after moistening the substrate dried by the IPA vapor drying method with only pure water. However, not only improvement in a joining strength but also decreasing of particle or organic substance contamination is possible by using megasonic or a brush together or using a solution of chemicals. For this reason, in the present invention, the suction drying method, a spin drying method, a hot water raising drying method or the like, which is the present drying method can also be used after the IPA vapor drying.

The present invention is not limited to the above-described embodiment. The above-described embodiment is a mere example, and those having the substantially same structure as that described in the appended claims and providing the similar action and effects are included in the scope of the present invention.

For example, it can be applied to material substrates other than a semiconductor substrate, for example, including an insulator substrate such as a quartz substrate, or a metal substrate. Moreover, it is applicable also to substrates with a pattern, such as a device.

Furthermore, although in the above-mentioned embodiment the delamination process in the hydrogen ion implantation delamination method is performed as a heat treatment, the energy equivalent to the heat treatment (electricity, plasma, high frequency or the like) can also be applied.

Moreover, it is also possible to form a fine defect layer in hydrogen high concentration layer by applying a heat treatment or the energy equivalent to the heat treatment, and then inject a fluid (gas, liquid) into the fine defect layer from the side of the substrate, followed by delamination of a bond wafer.

Moreover, a method for producing a bonded substrate is not limited to the above-mentioned hydrogen ion implantation delamination method. The present invention is also applied to a method wherein two substrates are bonded, and one of them is etched, ground, polished, or subjected to gas phase etching or the like to make a thin film, and achieve planarization.

What is claimed is:

1. A method for producing a bonded substrate comprising, at least, a process of joining two substrates and a process of subjecting the joined substrates to heat treatment to bond them firmly, wherein, at least, a process of cleaning for removing contaminants on the surface of the substrates is performed before joining the substrates, and then a process of drying the cleaned surface of the substrates is performed without using the water displacing method for the drying process by removing moisture on the cleaned surface of the substrate by sucking, so that moisture is left on the substrate surface to be joined to increase a joining strength after joining the substrates, and wherein the joining strength at a joining interface after joining is 0.25 N/m$^2$ or more.

2. A method for producing a bonded substrate comprising, at least, a process of joining two substrates and a process of subjecting the joined substrates to heat treatment to bond them firmly, wherein, at least, a process of cleaning for removing contaminants on the surface of the substrates is performed before joining the substrates, and then a process of drying the cleaned surface of the substrates is performed without using the water displacing method for the drying process, so that moisture is left on the substrate surface to be joined to increase a joining strength after joining the substrates, wherein the cleaning process is a process of performing the last rinse with hot water, and the following drying process is a process of evaporating to remove the hot water on the cleaned surface of the substrate.

3. The method for producing a bonded substrate according to claim 2, wherein the joining strength at a joining interface after joining is 0.25 N/m$^2$ or more.

4. The method for producing a bonded substrate according to claim 2 wherein in the drying process the substrate as a material is subjected to IR irradiation.

5. The method for producing a bonded substrate according to claim 3 wherein in the drying process the substrate as a material is subjected to IR irradiation.

6. The method for producing a bonded substrate according to claim 1 wherein the substrate to be material for a bonded substrate is a silicon substrate.

7. The method for producing a bonded substrate according to claim 6 wherein the substrate to be material for a bonded substrate is a silicon substrate having an oxide film.

8. The method for producing a bonded substrate according to claim 1 wherein the substrate to be material for a bonded substrate is those in which hydrogen, rare gas, or halogen gas is implanted.

9. The method for producing a bonded substrate according to claim 6 wherein the substrate to be material for a bonded substrate is those in which hydrogen, rare gas, or halogen gas is implanted.

10. The method for producing a bonded substrate according to claim 7 wherein the substrate to be material for a bonded substrate is those in which hydrogen, rare gas, or halogen gas is implanted.

11. The method for producing a bonded substrate according to claim 2 wherein the substrate to be material for a bonded substrate is a silicon substrate.

12. The method for producing a bonded substrate according to claim 11 wherein the substrate to be material for a bonded substrate is a silicon substrate having an oxide film.

13. The method for producing a bonded substrate according to claim 2 wherein the substrate to be material for a bonded substrate is those in which hydrogen, rare gas, or halogen gas is implanted.

14. The method for producing a bonded substrate according to claim 11 wherein the substrate to be material for a bonded substrate is those in which hydrogen, rare gas, or halogen gas is implanted.

15. The method for producing a bonded substrate according to claim 12 wherein the substrate to be material for a bonded substrate is those in which hydrogen, rare gas, or halogen gas is implanted.

16. A method for producing a bonded substrate comprising, at least, a process of joining two substrates and a process of subjecting the joined substrates to heat treatment to bond them firmly, wherein the substrate to be material for a bonded substrate is those in which hydrogen, rare gas, or halogen gas is implanted, and wherein, at least, a process of cleaning for removing contaminants on the surface of the substrates is performed before joining the substrates, and then a process of drying the cleaned surface of the substrates is performed without using the water displacing method for the drying process by removing moisture on the cleaned surface of the substrate by sucking, so that moisture is left on the substrate surface to be joined to increase a joining strength after joining the substrates.

17. The method for producing a bonded substrate according to claim 16 wherein the substrate to be material for a bonded substrate is a silicon substrate.

18. The method for producing a bonded substrate according to claim 17 wherein the substrate to be material for a bonded substrate is a silicon substrate having an oxide film.

* * * * *